(12) United States Patent
Fan et al.

(10) Patent No.: US 10,840,862 B2
(45) Date of Patent: Nov. 17, 2020

(54) CHOPPER STABILIZED AMPLIFIER WITH PARALLEL NOTCH FILTERS

(71) Applicant: NXP USA, INC., Austin, TX (US)

(72) Inventors: Bo Fan, Tianjin (CN); Meng Wang, Tianjin (CN)

(73) Assignee: NXP USA, Inc., Austin, TX (US)

( * ) Notice: Subject to any disclaimer, the term of this patent is extended or adjusted under 35 U.S.C. 154(b) by 43 days.

(21) Appl. No.: 16/294,937

(22) Filed: Mar. 7, 2019

(65) Prior Publication Data

US 2020/0091880 A1 Mar. 19, 2020

(30) Foreign Application Priority Data

Sep. 19, 2018 (CN) .......................... 2018 1 1098567

(51) Int. Cl.
  H03F 1/02 (2006.01)
  H03F 3/38 (2006.01)
  H03F 3/45 (2006.01)

(52) U.S. Cl.
  CPC .......... *H03F 3/38* (2013.01); *H03F 3/45475* (2013.01); *H03F 2200/171* (2013.01); *H03F 2200/375* (2013.01); *H03F 2200/459* (2013.01)

(58) Field of Classification Search
  CPC .................................. H03F 1/02; H03F 3/005
  USPC ............................................. 330/9; 327/124
  See application file for complete search history.

(56) References Cited

U.S. PATENT DOCUMENTS

| 7,209,000 | B2 | 4/2007 | Huijsing | |
|---|---|---|---|---|
| 7,764,118 | B2 | 7/2010 | Kusuda et al. | |
| 2009/0153241 | A1* | 6/2009 | Trifonov | H03F 3/393 330/9 |
| 2016/0056707 | A1* | 2/2016 | Wong | H03H 19/004 323/217 |

OTHER PUBLICATIONS

R. Burt and J. Zhang, "A micropower chopper-stabilized operational amplifier using a SC notch filter with synchronous integration inside the continuous-time signal path," IEEE J. Solid-State Circuits, vol. 41, No. 12, pp. 2729-2736, Dec. 2006.
M. Pertijs and W. J. Kindt, "A 140 dB-CMRR current-feedback instrumentation amplifier employing ping-pong auto-zeroing and chopping," IEEE ISSCC Dig. Tech. Papers, 2009, pp. 324-325.

(Continued)

*Primary Examiner* — Steven J Mottola

(57) ABSTRACT

A chopper stabilized amplifier includes a first transconductance amplifier, first chopping circuitry coupled to an input of the first transconductance amplifier for chopping an input signal and applying the chopped input signal to the input of the first transconductance amplifier, and second chopping circuitry coupled to an output of the first transconductance amplifier for chopping an output signal produced by the first transconductance amplifier. A ping-pong notch filter is connected to an output of the second chopping circuitry and performs an integrate and transfer function on a chopped output signal produced by the second chopping circuitry to filter ripple voltages. The ping-pong notch filter includes parallel connected first and second notch filters, each of which has an input coupled to the output of the second chopping circuitry.

15 Claims, 7 Drawing Sheets

(56) References Cited

OTHER PUBLICATIONS

Y. Kusuda, "Auto correction feedback for ripple suppression in a chopper amplifier," IEEE J. Solid-State Circuits, vol. 45, No. 8, pp. 1436-1445, Aug. 2010.
T. K. Tang, "A 3 uV-offset operational amplifier with 20 nV/rt(Hz) input noise PSD at DC employing both chopping and autozeroing," IEEE ISSCC Dig. Tech. Papers, 2002, pp. 362-387.
Texas Instrument OPA333 datasheet, SBOS351E—March 2006—Revised Dec. 2015.
Analog Devices, "ADA4522-1 Data Sheet, 55 V, EMI Enhanced, Zero Drift, Ultralow Noise, Rail-to-Rail Output Operational Amplifiers," 2015-2017, 33 pages.

* cited by examiner

CHOPPER STABILIZED AMPLIFIER WITH PARALLEL NOTCH FILTERS

BACKGROUND

The present invention relates to amplifier circuits, and, more particularly, to chopper stabilized amplifiers for ripple reduction.

Low offset voltage and low ripple noise are important for both instrumentation amplifiers and operational amplifiers. Inserting a chopper and increasing the stage gain are common techniques that have been widely used to reduce amplifier offset voltage. However, the output ripple noise of the basic chopper stabilized amplifier is still high. A basic chopper stabilized amplifier maintains broadband noise characteristics at the input stage, but shift the input offset voltage to the chopping signal, which creates large ripple voltages at the amplifier outputs.

FIG. 1 shows a conventional chopper stabilized amplifier 10 with an offset and ripple correction loop 12. The ripple voltage component of the chopper stabilized amplifier output can achieve about 10 µV. However, it has the disadvantage of a large on-chip capacitance and slow transient response due to stability requirement because the feedback loop doesn't have a very fast transient response.

FIG. 2 illustrates another conventional chopper stabilized amplifier 20 with a single notch filter 22 for reducing the ripple noise. The amplifier 20 includes a transconductance amplifier 24 and first and second chopper circuits 26 and 28 located before the input and after the output of the transconductance amplifier 24. FIG. 3 illustrates a waveform of the amplifier 20 of FIG. 2. As shown in FIGS. 2 and 3, the clock frequencies of the chopper stage and the notch filter stage are the same and have a 90 degrees phase shift. Capacitors C6 and C7 sample the chopper stage output voltage twice at each chopping cycle for both the positive chopping phase and the negative chopping phase and transfer the charge on the capacitors C6 and C7 to the capacitor C8 at every half notching period, as shown in FIG. 3. Due to process variations, the charge and discharge current of the amplifier GM1 is imbalanced. The rising and falling slope of the chopper stage output is not symmetric. A large ripple is generated at capacitor C8 and hence at the output due to this asymmetry. For example, if a 10 mV offset is inserted at the chopping stage, the ripple voltage component in the chopper stabilized amplifier output is about 1.7 mV, while the average output offset is less than 3 µV. The single notch filter 22 can remove the offset, but can't remove the output ripple noise.

Thus, it would be desirable to have a chopper stabilized amplifier with both low ripple noise and a low offset voltage.

SUMMARY

This summary is provided to introduce a selection of concepts in a simplified form that are further described below in the Detailed Description. This summary is not intended to be relied on to identify key features or essential features of the claimed subject matter, nor is it intended to be used to limit the scope of the claimed subject matter.

In accordance with one embodiment, the present invention provides a chopper stabilized amplifier including a first transconductance amplifier, first and second chopping circuitry, and a ping-pong notch filter. The first chopping circuitry is coupled to an input of the first transconductance amplifier for chopping an input signal and applying the chopped input signal to the input of the first transconductance amplifier. The second chopping circuitry is coupled to an output of the first transconductance amplifier for chopping an output signal produced by the first transconductance amplifier. The ping-pong notch filter has parallel connected first and second notch filters. Each of the first notch filter and the second notch filter has an input coupled to an output of the second chopping circuitry. The ping-pong notch filter performs an integrate and transfer function on a chopped output signal produced by the second chopping circuitry to notch-filter ripple voltages.

In one embodiment, there are 90° phase shifts between the clocks of the first notch filter and the second notch filter.

In one embodiment, the chopper stabilized amplifier further comprises a second transconductance amplifier having an input coupled to an output of the first notch filter; a third transconductance amplifier having an input coupled to an output of the second notch filter; and a fourth transconductance amplifier having an input coupled to an output of the second transconductance amplifier, with the combined output of the second and third transconductance amplifiers then being provided to the input of the fourth transconductance amplifier.

In one embodiment, the chopper stabilized amplifier further comprises a fifth transconductance amplifier having an input coupled to receive the input signal, and an output coupled to the combined output of the second and third transconductance amplifiers.

In yet another embodiment, the chopper stabilized amplifier further comprise a buffer coupled between an output of the third transconductance amplifier and an input the first notch filter.

The present invention also provides a method of operating a chopper stabilized amplifier. The method comprises chopping an input signal and applying the chopped input signal to an input of a first transconductance amplifier, and chopping an output signal produced by the first transconductance amplifier at a chopping frequency to produce a chopped output signal. A ping-pong notch filter, which includes parallel connected first and second notch filters performs an integrate and transfer function on a chopped output signal produced by the second chopping circuitry to notch filter ripple voltages.

BRIEF DESCRIPTION OF THE DRAWINGS

So that the manner in which the above recited features of the present application can be understood in detail, a more particular description of the application, briefly summarized above, may be had by reference to embodiments, some of which are illustrated in the appended drawings. It is to be noted, however, that the appended drawings illustrate only typical embodiments of this application and are therefore not to be considered limiting of its scope, for the application may admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
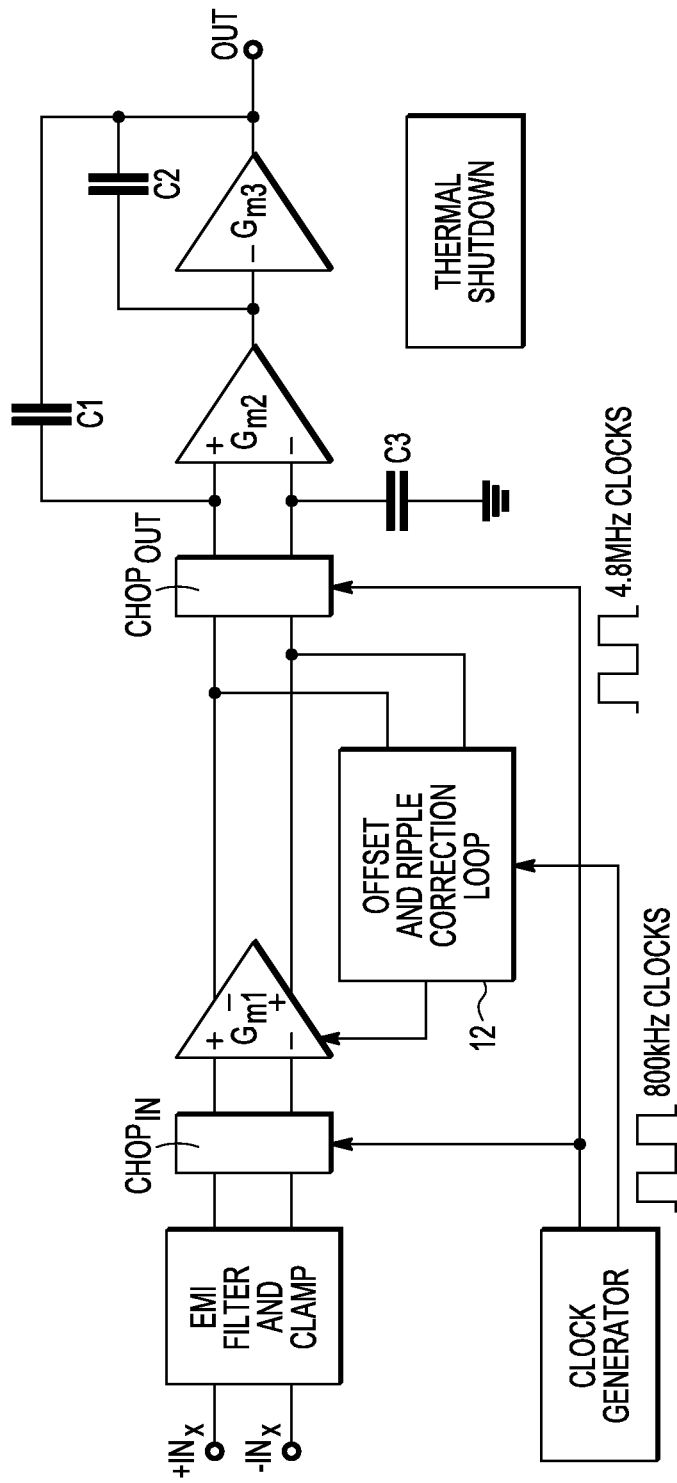
FIG. 1 is a schematic block diagram of a conventional chopper stabilized amplifier with an offset and ripple correction loop.
Figure 2:
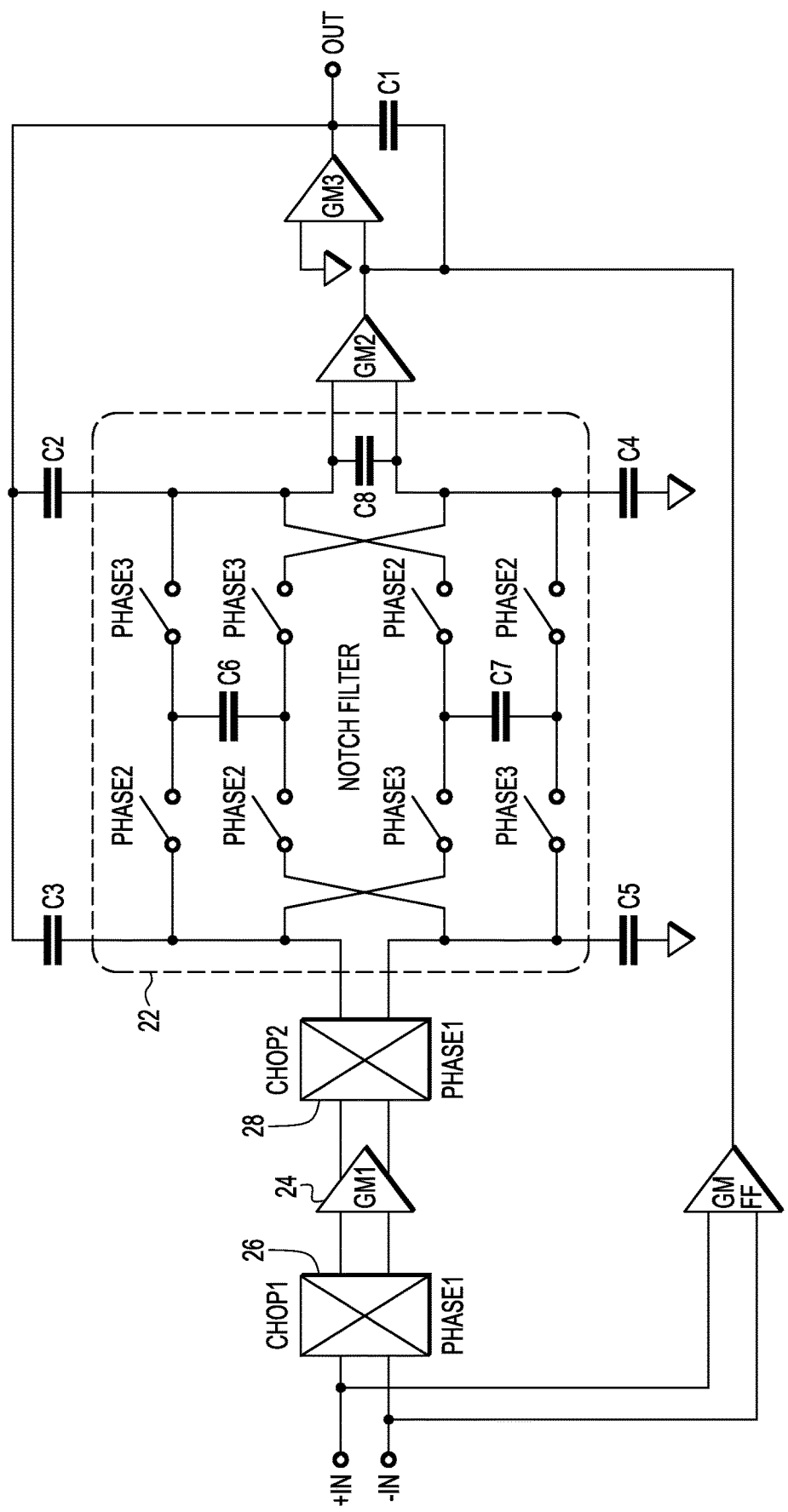
FIG. 2 is a schematic block diagram of another conventional chopper stabilized amplifier with a single notch filter for reducing ripple noise.
Figure 3:
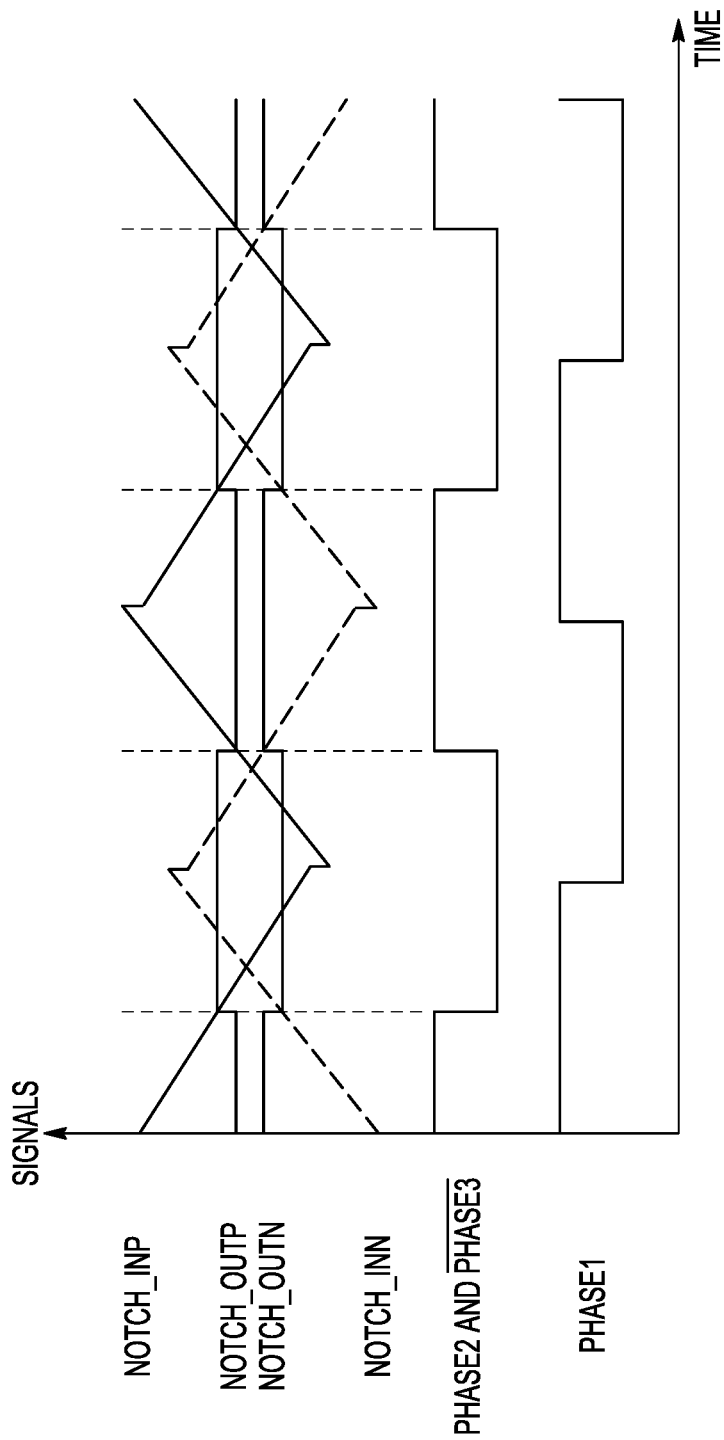
FIG. 3 shows the notch filter waveform for the circuit of FIG. 2.

Referring to FIG. 1, a chopper stabilized amplifier 400 includes a negative (−) input terminal and a positive (+) input terminal by means of which an input signal Vin is applied to first chopping circuitry 401. The output terminal of the first chopping circuitry 401 is connected to the input terminal of a transconductance amplifier 402. The first chopping circuitry 401 chops the input signal Vin and applies the chopped input signal to the input of the transconductance amplifier 402. The output of the transconductance amplifier 402 is connected to the input second chopping circuitry 403. The second chopping circuitry 403 chops an output signal produced by the transconductance amplifier 402. Chopping circuitry is known in the art (see, e.g., FIG. 2, chopping circuits 26 and 28), so further description of these elements is not necessary here. The chopped output signal produced by the second chopping circuitry 403 is provided to first and second notch filters 404 and 405. The first and second notch filters 404 and 405 are connected in parallel.

The notch filters 404 and 405 receive respective clock signals, and there are 90° phase shifts between these clock signals, as will be discussed further below.

The first notch filter 404 includes a first switch 406A connected between a first node N1 and a second node N2, a second switch 406B connected between the second node N2 and a third node N3, a third switch 406C connected between fourth and fifth nodes N4 and N5, and a fourth switch 406D connected between the fifth node N5 and a sixth node N6. A first integrate and transfer capacitor C1 is connected between the second node N2 and the fifth node N5. The first notch filter 404 also includes a fifth switch 407A connected between the first node N1 and a seventh node N7, a sixth switch 407B connected between the seventh node N7 and the third node N3, a seventh switch 407C connected between the fourth node N4 and an eighth node N8, and an eighth switch 407D connected between the eighth node N8 and the sixth node N6. A second integrate and transfer capacitor C2 is connected between the seventh node N7 and the eighth node N8. A third capacitor C3 is connected between the third node N3 and the sixth node N6. The third capacitor C3 improves filtering and ripple noise reduction. A second transconductance amplifier 408 has an input connected to the output of the first notch filter 404 at the third and sixth nodes N3 and N6, and a third transconductance amplifier 409 has an input connected to the output of the second transconductance amplifier 408.

The second notch filter 405 is similar to the first notch filter 404. The second notch filter 405 includes a ninth switch 410A connected between a ninth node N9 and a tenth node N10, a tenth switch 410B connected between the tenth node N10 and an eleventh node N11, an eleventh switch 410C connected between a twelfth node N12 and a thirteenth node N13, and twelfth switch 410D connected between the thirteenth node N13 and a fourteenth node N14. An fourth integrate and transfer capacitor C4 is connected between the tenth node N10 and the thirteenth node N13. The second notch filter 405 also includes a thirteenth switch 411A connected between the ninth node N9 and a fifteenth node N15, a fourteenth switch 411B connected between the fifteenth node N15 and the eleventh node N11, a fifteenth switch 411C connected between the twelfth node 12 and a sixteenth node N16, and a sixteenth switch 411D connected between the sixteenth node N16 and the fourteenth node N14. A fifth integrate and transfer capacitor C5 is connected between the fifteenth node N15 and the sixteenth node 16. A sixth capacitor C6 is connected between the eleventh node N11 and the fourteenth node N14. A fourth transconductance amplifier 412 has an input connected to the output of the second notch filter 405, and more particularly, to the eleventh and fourteenth nodes N11 and N14. The output of the fourth transconductance amplifier 412 is connected to the output of the second transconductance amplifier 408, and then the combined amplifier outputs are together provided to the input of the fourth transconductance amplifier 409. More particularly, the outputs of the second and fourth amplifiers 408 and 412 (combined) are provided to the negative (−) input terminal of the third amplifier 409, while the positive (+) input terminal of the third amplifier 409 is connected to ground.

The second notch filter 405 connected in parallel with the first notch filter 404 in a ping-pong arrangement allows the chopper stabilized amplifier 400 to achieve low ripple, with the notched filters 404 and 405 suppressing the ripple generated by the offset of the first transconductance amplifier 402. In the single notch filter arrangement shown in FIG. 2, there is an output ripple that has not been removed. However, the ping-pong arrangement of the present invention removes the output ripple.

A fifth, feed-forward transconductance amplifier 413 has a negative (−) input terminal and (+) input terminal, which receive the input signal (Vin). The output of the feed-forward transconductance amplifier 413 is connected to the input of the third transconductance amplifier 409.

The transconductances of the first transconductance amplifier 402, the second transconductance amplifier 408, the third transconductance amplifier 409, the fourth transconductance amplifier 412 and the fifth transconductance amplifier 413 are GM1, GM2, GM3, GM4 and GM FF, respectively.

In one embodiment, the first node N1 of the first notch filter 404 is connected to one terminal of seventh capacitor C7, and the third node N3 is connected to one terminal of an eighth capacitor C8. The other terminals of the seventh and eighth capacitors C7 and C8 are connected to the output of the third transconductance amplifier 409. The fourth node N4 is connected to one terminal of a fifth capacitor C9, and the node N6 is connected to one terminal of tenth capacitor C10. The other terminals of the ninth and tenth capacitors C9 and C10 are connected to ground.

In one embodiment, the node N11 of the second notch filter 405 is connected to one terminal of an eleventh capacitor C11, and the other terminal of the eleventh capacitor C11 is connected to the output of the third transconductance amplifier 409. The fourteenth node N14 of the notch filter 405 is connected to one terminal of a twelfth capacitor C12, and the other terminal of the twelfth capacitor C12 is connected to ground.

In one embodiment, a thirteenth capacitor C13 is connected between the output of the third transconductance amplifier 409 and the output of the feed-forward (fifth) transconductance amplifier 413.

Figure 4:
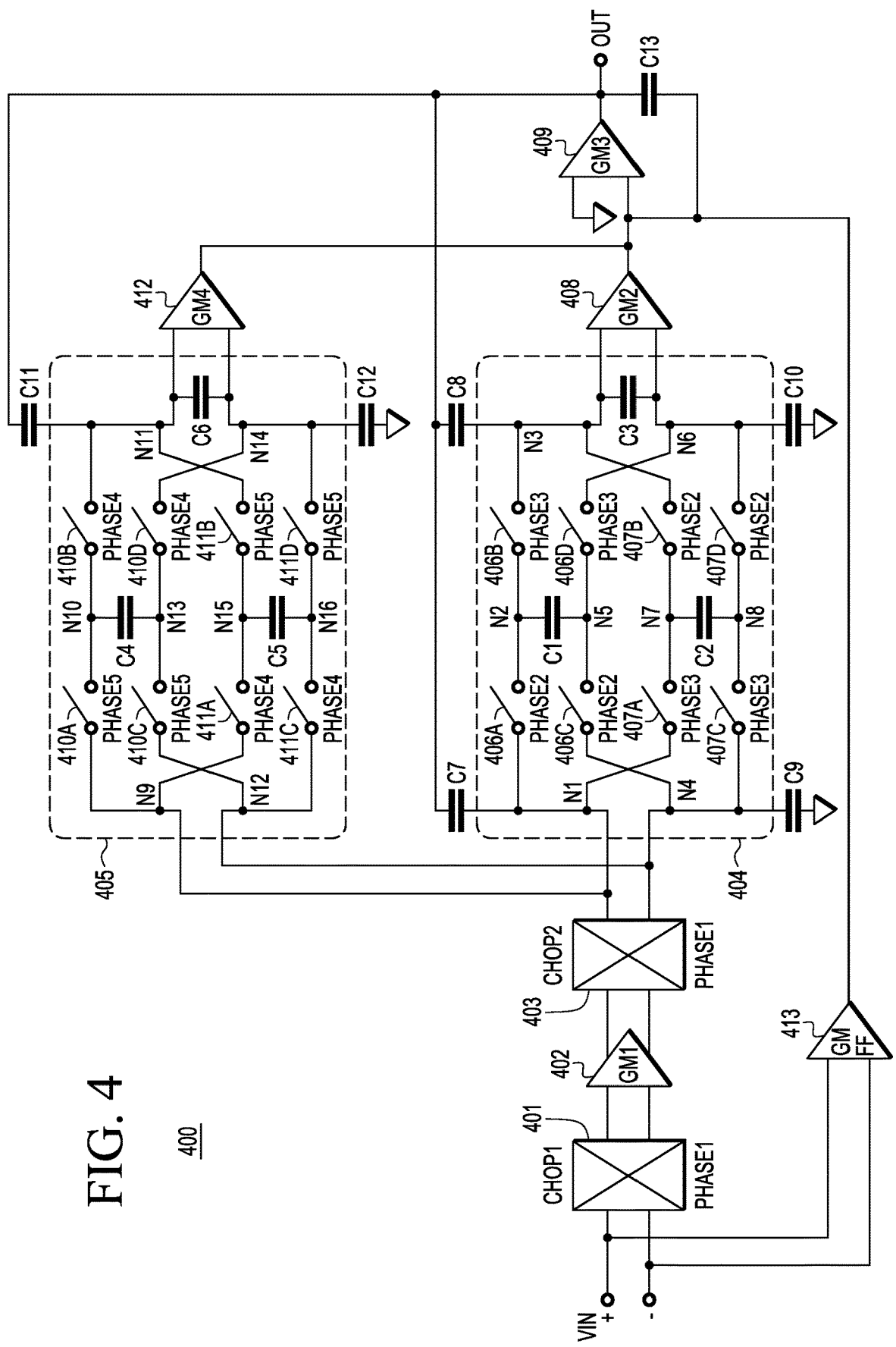
FIG. 4 is a schematic block diagram of a chopper stabilized amplifier in accordance with one exemplary embodiment of the present invention.
Figure 5:
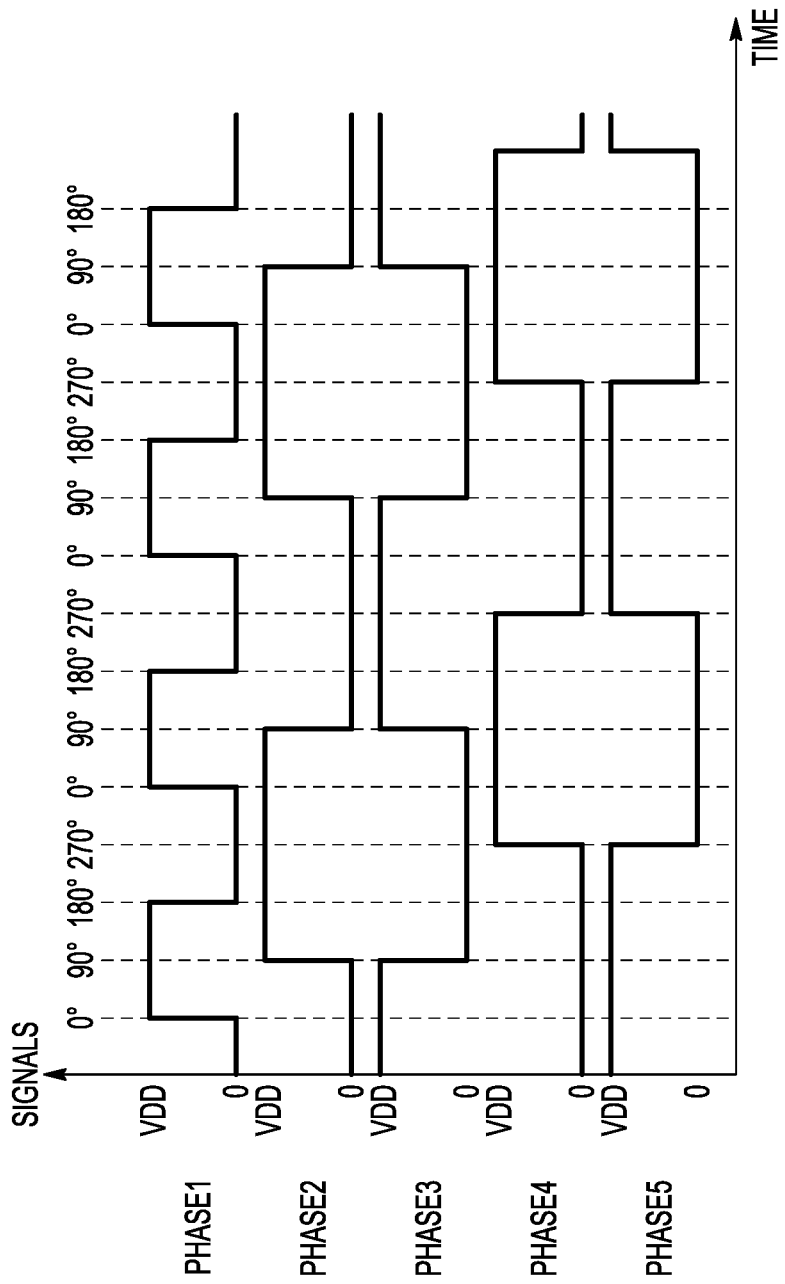
FIG. 5 is a timing diagram for one mode of operation of the chopper stabilized amplifier of FIG. 4.

FIG. 5 shows a timing diagram for one mode of operation of the chopper stabilized amplifier 400 of FIG. 4. Clock signals Phase1, Phase2, Phase3, Phase4 and Phase5 are used to control the chopping signals and notch filter switches, as shown in FIG. 4. Phase 1 controls the chopping signals of the chopping circuitry 401 and the chopping circuitry 403. Phase 2 controls switches 406A, 406C, 407B and 407D. Phase 3 controls switches 406B, 406D, 407A and 407C. Phase 4 controls switches 410B, 410D, 411A and 411C. Phase 5 controls switches 410A, 410C, 411B and 411D. In FIG. 5, the Phase 2 and Phase 3 notch filter clock signals are out of phase with each other and operate at half of the frequency of chopping signals Phase 1 with a quarter period delay of the chopping signal. The quarter period delays allows 90 degrees delay, which means the chopping signal and the notch filter clock signals are orthogonal with each other, which degrades the higher harmonics and is useful to reduce flicker noise. Each of the first and second notch filters 404 and 405 includes two parallel signal paths, each with switched operating at the frequency that is half of the frequency of the chopping signal.

The switches 410A, 410B, 410C and 410D are controlled by Phase 4 and the switches 411A, 411B, 411C and 411D are controlled by Phase 5. The frequencies Phase 4 and Phase 5 clock signals are out of phase of the Phase 2 and Phase 3 filter clock signals. The chopped output signal generated by the second chopping circuitry 403 is sampled by the notching filters 404 and 405 during positive and negative chopping phases respectively. For example, when Phase1 is high, the voltage of the chopped output signal is sampled at the mid-point of the high state of phase1 by C1 and C2, and the charge on C1 and C2 is transferred to C3. When Phase1 is low, the voltage of the chopped output signal is sampled at the mid-point of low state of phase1 by C4 and C5, and the charge on C4 and C5 is transferred to C6. The voltages on C3 and C6 are provided to the second and fourth transconductance amplifiers 408 and 412 respectively and the output of the second and fourth transconductance amplifiers 408 and 412 are combined. Because the positive phase and negative phase is sampled respectively by two notching filters 404 and 405, the asymmetry of GM1 is suppressed and hence very small ripple is achieved.

Figure 6:
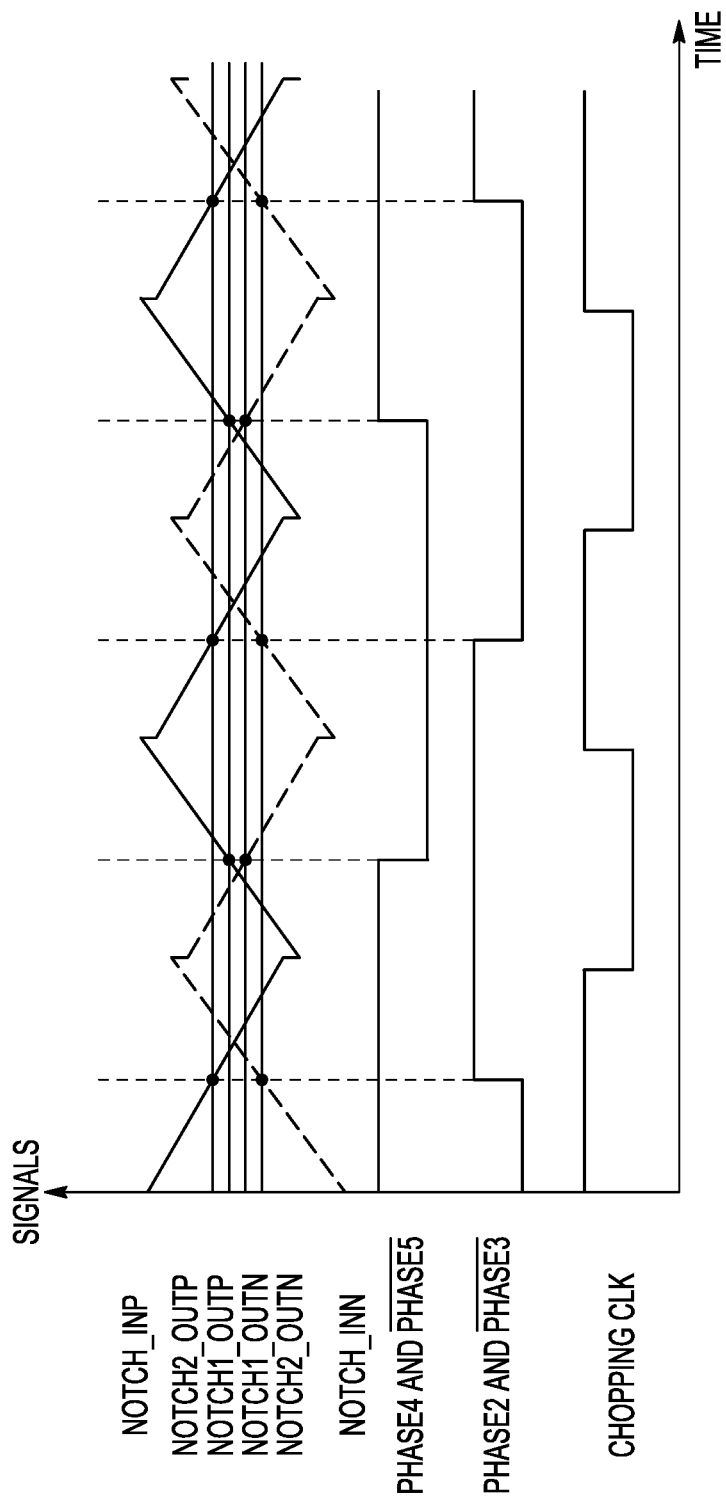
FIG. 6 shows a waveform for the circuit of FIG. 4.

FIG. 6 shows a waveform of the output of the first and second notch filters 404 and 405 for the circuit 400 of FIG. 4. In one embodiment, all the positive output Notch2_outp of notch filter 404 are on the falling edge of the positive notch input signal Notch_inp generated by the second chopping circuitry 403. All the negative outputs Notch2_outn of the first notch filter 404 are on the rising edge of the negative notch input signal Notch inn generated by the chopping circuitry 403. Likewise, all the positive output Notch1_outp of the second notch filter 405 are on the rising edge of the positive notch input signal Notch_inp generated by the second chopping circuitry 403. All the negative output Notch1_outn of second notch filter 405 are on the falling edge of the negative notch input signal Notch inn generated by the second chopping circuitry 403. In one embodiment, if 10 mV offset is inserted at the chopping stage, the output of the ping-pong notch filter of the present invention realizes about 70 µV ripple voltage, while the ripple voltage of the conventional single notch filter (FIG. 2) is about 1.77 mV. The ripple noise of the ping-pong notch filter can be reduced efficiently.

Figure 7:
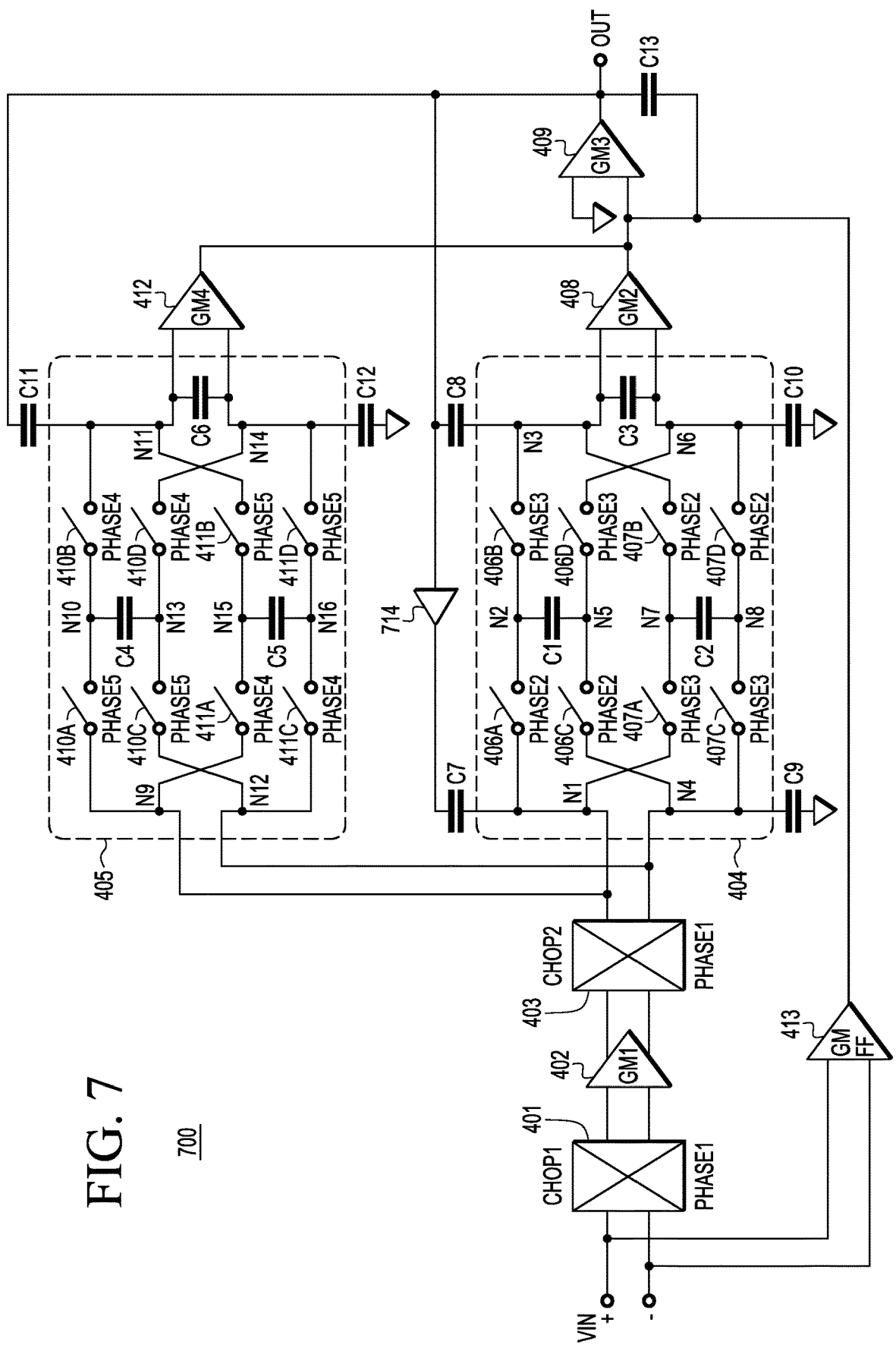
FIG. 7 is a schematic block diagram of a chopper stabilized amplifier in accordance with another exemplary embodiment of the present invention.

FIG. 7 is a block diagram of a chopper stabilized amplifier 700 in accordance with another exemplary embodiment of the present invention. The difference between the circuits illustrated in FIG. 7 and FIG. 4 is that the chopper stabilized amplifier 700 includes a buffer 714 coupled between the input terminal of the first notch filter 404 and the output terminal of the third transconductance amplifier 409. The buffer 714 is provided to even further reduce the ripple voltage. For example, if the insert offset as 10 mV, the chopper stabilized amplifier 700 714 can reduce the ripple voltage from about 70 µV to 15 µV.

The present invention also provides a method of operating a chopper stabilized amplifier. The method includes the steps of chopping an input signal and applying the chopped input signal to an input of a first transconductance amplifier, and chopping an output signal produced by the first transconductance amplifier at a chopping frequency to produce a chopped output signal. Then, parallel connected first and second notch filters are used to perform an integrate and transfer function on the chopped output signal produced by the second chopping circuitry to notch filter ripple voltages.

Thus, the present invention provides a chopper stabilized amplifier and a method of operating a chopper stabilized amplifier using ping-pong notch filter to reduce both the offset voltage and ripple noise of the chopper stabilized amplifier.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:
1. A chopper stabilized amplifier, comprising:
 a first transconductance amplifier;

first chopping circuitry coupled to an input of the first transconductance amplifier for chopping an input signal and applying the chopped input signal to the input of the first transconductance amplifier;

second chopping circuitry coupled to an output of the first transconductance amplifier for chopping an output signal produced by the first transconductance amplifier; and a ping-pong notch filter comprising parallel connected first and second notch filters, wherein each of the first notch filter and the second notch filter has an input coupled to an output of the second chopping circuitry and wherein the ping-pong notch filter performs an integrate and transfer function on a chopped output signal produced by the second chopping circuitry to filter ripple voltages in the chopped output signal.

2. The chopper stabilized amplifier of claim 1, wherein there are 90 degrees phase shift between clocks of the first notch filter and the second notch filter.

3. The chopper stabilized amplifier of claim 1, wherein the first notch filter has first and second input terminals, and first and second output terminals, and wherein the first notch filter includes:

a first path including a first switch coupled between the first input terminal and a first node, a second switch coupled between the first node and the first output terminal, a third switch coupled between the first input terminal and a second node, a fourth switch coupled between the second node and the second output terminal;

a second path including a fifth switch coupled between the first input terminal and a third node, a sixth switch coupled between the third node and the first output terminal, a seventh switch coupled between the second input terminal and a fourth node, an eighth switch coupled between the fourth node and the second output terminal; and a firth integrate and transfer capacitor coupled between the first and second nodes and a second integrate and transfer capacitor coupled between the third and fourth nodes.

4. The chopper stabilized amplifier of claim 3, wherein the chopped output signal is controlled by a first clock signal, the first, third, sixth and eighth switches are controlled by a second clock signal, and the second, fourth, fifth and seventh switches are controlled by a third clock signal, wherein the frequencies of the second and third clock signals is half of the frequency of the first clock signal.

5. The chopper stabilized amplifier of claim 4, wherein the second clock signal and the third clock signal are out of phase with each other.

6. The chopper stabilized amplifier of claim 3, wherein the second notch filter has third and fourth input terminals, and third and fourth output terminals, and wherein the second notch filter includes:

a third path including a ninth switch coupled between the third input terminal and a fifth node, a tenth switch coupled between the fifth node and the third output terminal, an eleventh switch coupled between the fourth input terminal and a sixth node, a twelfth switch coupled between the sixth node and the fourth output terminal;

a fourth path including a thirteenth switch coupled between the third input terminal and a seventh node, a fourteenth switch coupled between the seventh node and the third output terminal, a fifteenth switch coupled between the fourth input terminal and a eighth node, an sixteenth switch coupled between the eighth node and the fourth output terminal; and a first integrate and transfer capacitor coupled between the fifth and sixth nodes and a second integrate and transfer capacitor coupled between the seventh and eighth nodes.

7. The chopper stabilized amplifier of claim 6, wherein the tenth, twelfth, fourteenth and fifteenth switches are controlled by a fourth clock signal and the ninth, eleventh, fourteenth and sixteenth switches are controlled by a fifth clock signal.

8. The chopper stabilized amplifier of claim 7, wherein the fourth clock signal and the fifth clock signals have the same frequency.

9. The chopper stabilized amplifier of claim 7, wherein the frequency of the fourth and fifth clock signals is half of the frequency of the first clock signal.

10. The chopper stabilized amplifier of claim 1, further comprising:

a second transconductance amplifier having an input coupled to an output of the first notch filter;

a third transconductance amplifier having an input coupled to an output of the second notch filter; and a fourth transconductance amplifier having an input coupled to an output of the second transconductance amplifier and an output of the third transconductance amplifier.

11. The chopper stabilized amplifier of claim 10, further comprising a fifth transconductance amplifier having an input coupled to receive the input signal, and an output coupled to the outputs of the second and third transconductance amplifiers.

12. The chopper stabilized amplifier of claim 10, further comprising a buffer coupled between the input of the first notch filter and an output of the fourth transconductance amplifier.

13. A method of operating a chopper stabilized amplifier, the method comprising:

chopping an input signal and applying the chopped input signal to an input of a first transconductance amplifier;

chopping an output signal produced by the first transconductance amplifier at a chopping frequency to produce a chopped output signal; and performing an integrate and transfer function on a chopped output signal produced by the second chopping circuitry with a ping-pong notch filter to filter ripple voltages in the chopped output signal, wherein the ping-pong notch filter comprises parallel connected first and second notch filters.

14. The method of operating a chopper stabilized amplifier of claim 13, wherein there are 90 degrees phase shifts between clocks of the first and second notch filters.

15. The method of operating a chopper stabilized amplifier of claim 13, wherein frequencies of clocks of the first and second notch filters are half of the frequency of the chopped output signal.

* * * * *